United States Patent
Takeda

[11] Patent Number: 5,940,411
[45] Date of Patent: Aug. 17, 1999

[54] DATA SHUFFLING METHOD AND APPARATUS FOR SAME

[75] Inventor: Takayuki Takeda, Kanagawa, Japan

[73] Assignee: Sony Corporation, Tokyo, Japan

[21] Appl. No.: 09/007,202

[22] Filed: Jan. 14, 1998

Related U.S. Application Data

[62] Division of application No. 08/673,193, Jun. 27, 1996, Pat. No. 5,841,781.

[30] Foreign Application Priority Data

Jun. 30, 1995 [JP] Japan ................................. 7-165377

[51] Int. Cl.$^6$ ........................................................ G06F 11/00
[52] U.S. Cl. .................................................................. 371/2.1
[58] Field of Search ................................ 371/2.1; 348/469; 370/506

[56] References Cited

U.S. PATENT DOCUMENTS 5,627,941  5/1997  Takahashi et al. ........................ 395/22

*Primary Examiner*—Phung M. Chung
*Attorney, Agent, or Firm*—Frommer Lawrence & Haug, LLP.; William S. Frommer

[57] ABSTRACT

A data shuffling method for shuffling data for rearranging predetermined data which are contained in a plurality of data units in predetermined numbers each and can be interpolated by using adjoining data in a two-dimensional array comprised of these data units so as to facilitate concealment of data errors occurring during transmission.

2 Claims, 14 Drawing Sheets

FIG. 10

DATA SHUFFLING METHOD AND APPARATUS FOR SAME

This application is a division of prior application Ser. No. 08/673,193, filed on Jun. 27, 1996, which is now U.S. Pat. No. 5,841,781.

BACKGROUND OF THE INVENTION

1. Field of the Invention

The present invention relates to a data shuffling method for shuffling data having a predetermined arrangement such as video data for which interpolation of data error is possible by using the adjoining data and to an apparatus for the same.

2. Description of the Related Art

In most cases, the data of pixels constituting a video signal have some correlation with the adjoining pixel data. Even in a case where a data error is generated in the data of a predetermined pixel, the data error can be concealed by using the data of the pixels on the periphery thereof. On the other hand, data error caused during the transmission of video data frequently occurs due to noise etc. and it is a rare case that the data error is uniformly distributed in the entire video data during the transmission. The data error is frequently concentrated at a specific position. For this reason, when transmitting video data, signal processing referred to as "shuffling" is carried out so that the data error generated during the transmission and concentrated at a specific position is not concentrated at any specific region of the original video.

The shuffling is processing wherein the arrangement of the data of the pixels constituting the original video signal is changed so that the adjoining pixel data are not together affected by noise etc. and the data of adjoining pixels in the original video are spaced away from each other at a predetermined interval in the transmission frame used for the transmission.

In the shuffling processing, for example when the pixel data are stored in a memory circuit in the original order and the stored video data are read, the pixel data are read in an order which is preliminarily set in a ROM table and differs from the original order. By changing the order, the adjoining pixel data are dispersed in the memory circuit.

Heretofore, there has not been known any system or apparatus for performing transmission after shuffling the video data.

In cases other than a transmission system, for example, a D2 type video tape recorder or the like performs the shuffling by dividing the video data for every 85 lines in the case of the NTSC system when recording the video data on a video tape.

Due to the relation of the recording format etc., however, the shuffling must be carried out while dividing one field into three segments and one line and 445 samples' worth of dummy data is added to the last segment. For this reason, if this system is used for transmission, there is a large waste in transmission. Therefore, it is difficult to adopt this system as the shuffling method at the time of transmission.

Further, at the present time, a communication line of an asynchronous transmission mode (ATM system) has been put into practical use. Studies are being made on the transmission of video data via a communication line of the ATM system. When the communication lines of this ATM system stretch out over the entire world, it is expected that the quality of the communication lines will greatly differ depending upon the area or distance.

For this reason, it is expected that there will be cases where the method of the shuffling processing must be changed in accordance with the quality of the communication line. That is, where the data error rate of a communication line is sufficiently low, it is expected that the delay time in processing will be regarded as more important than the error correcting capability and shuffling processing which has a short processing delay and is simple will be carried out, while where the data error rate of the communication line is high, the error correcting capability will be regarded as more important than the delay time in processing and the need will arise for performing shuffling which has a long processing delay and is complex.

According to the method using a ROM table as mentioned above, however, it becomes necessary to change the content of the ROM table whenever the method of the shuffling processing is changed, therefore the change of the method of the shuffling processing in accordance with the quality of the communication line is difficult.

On the other hand, where the same shuffling processing is carried out with respect to communication lines having a greatly different data error rate as mentioned above, it is expected that the data error generated in the video data will not be able to be completely concealed and that the quality of the video after the reproduction will be lowered. Further, conversely, irrespective of the fact that the transmission can be carried out via a communication line having a sufficiently small data error rate, it is expected that a large transmission delay will be uselessly induced by the shuffling processing.

SUMMARY OF THE INVENTION

An object of the present invention is to provide a data shuffling method in which the dummy data to be added to the video data is reduced as much as possible and an apparatus for the same.

Another object of the present invention is to provide a data shuffling method with which the video data etc. can be shuffled by the optimum shuffling method in accordance with the quality of the communication line and an apparatus for the same.

Still another object of the present invention is to provide a data shuffling method with which the shuffling can be carried out by a method which is complex and has a high concealment capability with respect to data error when the quality of the communication line is bad and the shuffling can be carried out by a method having a small processing delay when the quality of the communication line is good.

According to a first aspect of the invention, there is provided a data shuffling method for shuffling data for rearranging predetermined data which are contained in a plurality of data units in predetermined numbers each and can be interpolated by using adjoining data in a two-dimensional array comprised of these data units so as to facilitate concealment of data errors occurring during transmission etc., comprising dividing the two-dimensional array into a plurality of processing units each containing a predetermined number of the data units; establishing correspondence between each of the predetermined data and each serial number indicating the position of each of the predetermined data in each the processing units for every processing unit; calculating for every processing unit each of the sums or differences of each of the serial numbers corresponding to each of the predetermined data with a predetermined coefficient; calculating for every processing unit each of the values of the remainder system of each of the sums or differences with respect to the maximum value of the serial numbers; and arranging each of the predetermined data corresponding to each of the values of the remainder system at a position in the processing unit indicated by each of the values of the remainder system to shuffle the predetermined data for every processing unit.

The present invention rearranges predetermined data which can be interpolated by using adjoining data like the video data of each of the pixels constituting lines constituting a video and facilitating the concealment of the data error generated during the transmission on the reception side. In the data shuffling method according to the present invention, for example, a video is divided into a plurality of processing blocks (processing units) constituted by a predetermined number of lines and correspondence is established between serial numbers indicating the positions in the respective processing blocks and the video data. The sums obtained by adding the predetermined coefficient to the serial numbers are calculated for every processing block, each of the values of the remainder system of the sums with respect to the number of the video data contained in each of the processing blocks (maximum value of the serial numbers) is calculated, and the values of the remainder system are rearranged to positions in new processing blocks of the corresponding video data so as to perform the shuffling. A whole number by which the values of the remainder system do not overlap where the values of the remainder system are found by addition to the serial numbers and with which destroyed video data, resulting when data error occurs in a burst within a predetermined range of the video data during the transmission and all of the video data contained in a predetermined number of continuous lines are destroyed, hold a predetermined interval from each other so that the destroyed data can be concealed by using the adjoining data in the vertical and horizontal directions is defined as the predetermined coefficient in each of the processing blocks.

Preferably, each of the predetermined coefficients corresponding to each of the processing units is set so that the values of the remainder system do not overlap in each of the processing units and so that when all of the predetermined data contained in only a predetermined number of successive data units at any position of each of the processing units after the shuffling are destroyed, the destroyed predetermined data hold a predetermined interval among them when these predetermined data are returned to the positions in each of the processing units before the shuffling.

According to a second aspect of the invention, there is provided a data shuffling apparatus for rearranging the video data contained in each of the lines constituting a video so as to shuffle the same, having a video data storing means for storing each of the video data contained in a processing block for every processing block each constituted by a predetermined number of lines; a reading address generating means for performing a predetermined operational processing by using a predetermined coefficient corresponding to the processing block for every processing block and successively generating a reading address for reading the video data from the video data storing means; and a video data shuffling means for successively reading the video data from the video data storing means based on the reading address for every processing block and shuffling the same.

Preferably, each of the predetermined coefficients corresponding to each of the processing units is set so that the values of the remainder system do not overlap in each of the processing units and so that when all of the video data contained in only a predetermined number of successive lines at any position of each of the processing blocks after the shuffling are destroyed, the destroyed video data hold a predetermined interval among them when these video data are returned to the position in each of the processing blocks before the shuffling.

More preferably, the reading address generating means has an operating means for successively calculating each of the sums or differences of the address of the video data storing means storing each of the video data with the predetermined coefficient; and a remainder system calculating means for successively calculating the value of the remainder system of each of the sums with respect to the address of the most significant side at which the video data storing means stores the video data or the value of the remainder system of each of the differences with respect to the address of the least significant side as the reading address.

BRIEF DESCRIPTION OF THE DRAWINGS

These and other objects and features of the present invention will become clearer from the following description of the preferred embodiments given with reference to the attached drawings, in which:

Figure 10:
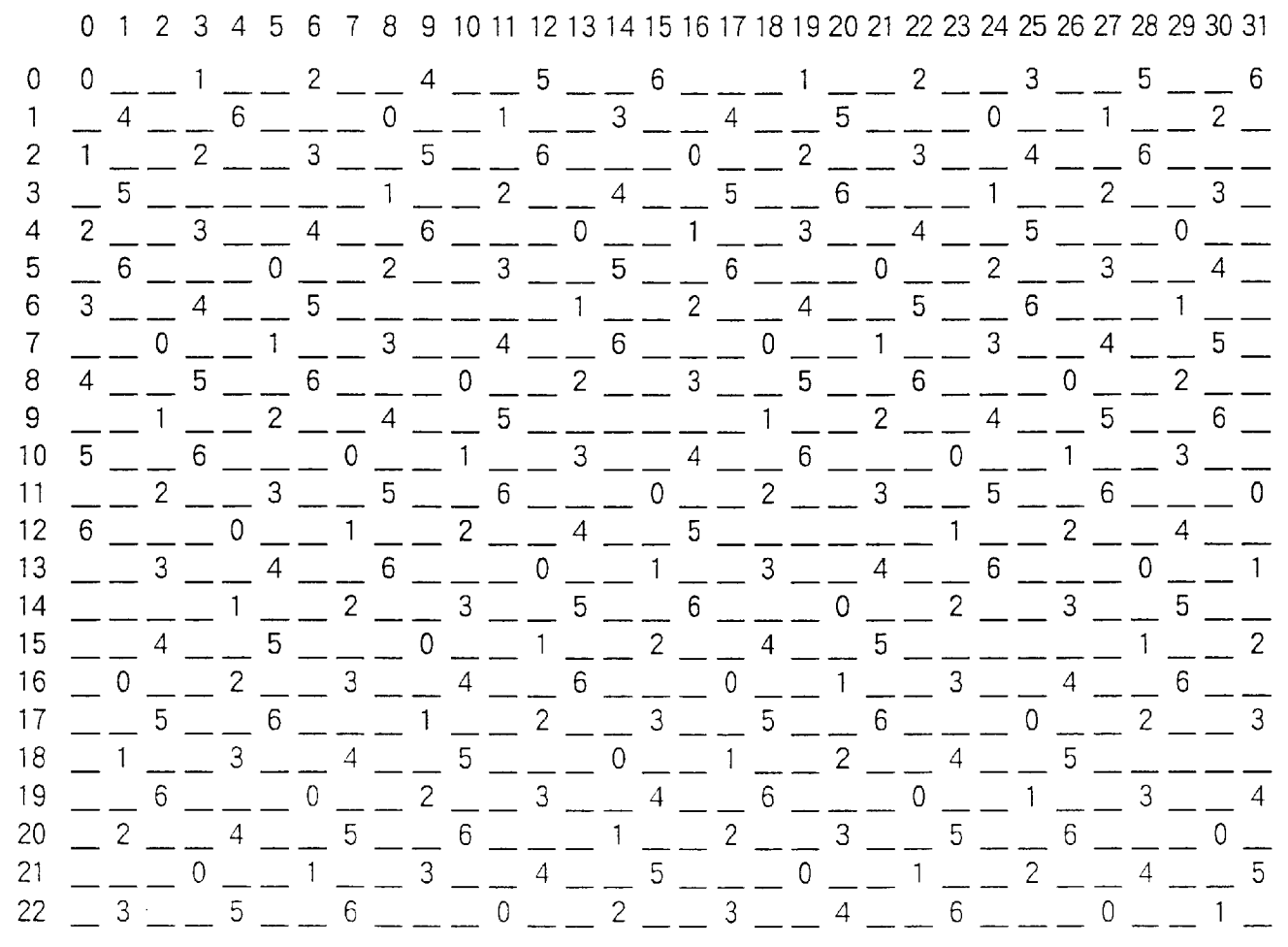

FIG. 10 is a view exemplifying the arrangement of the video data returned to the original arrangement when a data error occurs in the 0th to sixth lines of the video data after the shuffling shown in FIG. 9;

DESCRIPTION OF THE PREFERRED EMBODIMENTS

Preferred embodiments of the present invention will be explained.

Figure 1:
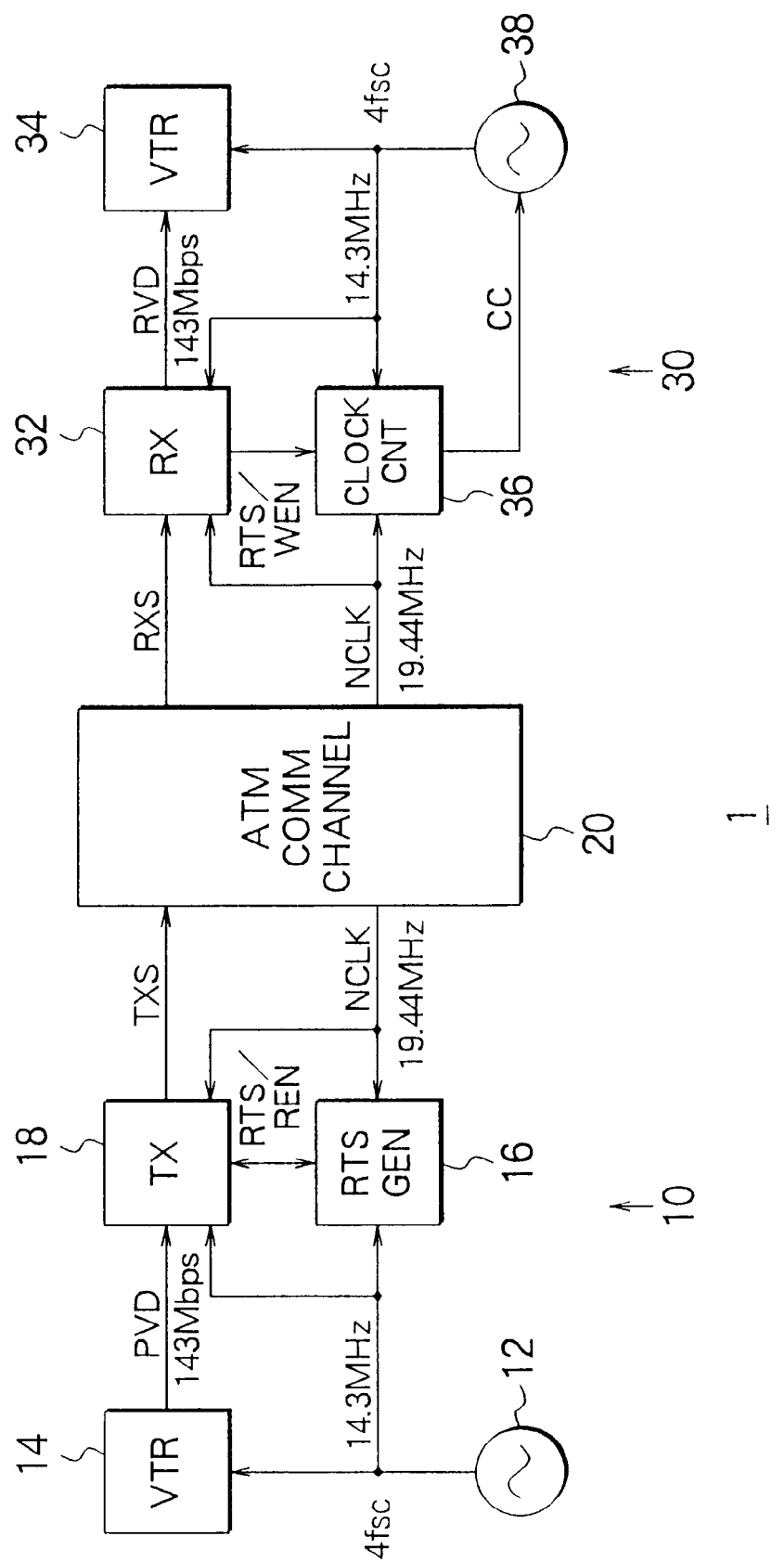
FIG. 1 is a view of the configuration of a data transmitting system according to the present invention.

FIG. 1 is a view of the configuration of a data transmitting system 1 according to the present invention.

The data transmitting system 1 is constituted by a transmitting apparatus 10 on a transmission side, an ATM communication line 20, and a transmitting apparatus 30 on a reception side. Note that, in actuality, not only the two transmitting apparatuses of 10 and 30, but also a further larger number of transmitting apparatuses are connected to the ATM communication line 20. Also, the transmitting apparatuses 10 and 30 each include constituent portions corresponding to the transmitting apparatuses 30 and 10, respectively, but they are omitted in FIG. 1 for simplification of illustration. In this data transmitting system 1, the transmitting apparatuses 10 and 30 of an SDI (Serial Digital Interface) system operating based on internal clocks $4f_{sc}$ (so-called house clocks) which are respectively independently generated transmit between them predetermined data, for example audio and video data for a program via the ATM communication line 20 operating based on a line clock NCLK produced independently from the internal clocks $4f_{sc}$ used by the transmitting apparatuses 10 and 30 and having different standards.

The frequency of the line clocks NCLK used when dividing into eight the frequency of a clock of 155.52 MHz supplied from the ATM communication line 20 to the transmitting apparatuses 10 and 30 and processing an ATM cell as 8 bit-parallel data is 19.44 MHz (155.52/8). On the other hand, the internal clock $4f_{sc}$ generated when performing the transmission by the SDI system is about 14.3 MHz as shown in the following equation. Where they are accurate, the frequencies of these clocks exhibit the relationship of a integral ratio (NCLK:$4f_{sc}$=1188:875):

$$f_h = 4.5 \text{ MHz}/286$$
$$4f_{sc} = 910 \times f_h$$
$$\approx 14.3 \text{ (MHz)} \qquad (1)$$

Note, in Equation 1, 4.5 MHz is the frequency of an audio carrier in the band of a television signal of the current NTSC system. Further, the numerical value 286 and the numerical value 910 in Equation 1 are the numerical values used for generating the frequency of a color television signal by using the audio carrier. The frequency of the internal clock signal $4f_{sc}$ and the frequency of the chroma signal exhibit a relationship of $4f_{sc}/4$, the frequency of a horizontal synchronization signal has a relationship of $4f_{sc}/910$, and the frequency of a vertical synchronization signal has a relationship of $4f_{sc}/((910 \times 525)/2) \approx (4f_{sc}(910 \times 286))$. The frequency of the color television signal is determined in this way for the purpose of maintaining the interchangeability between a monochrome television and a color television and preventing the sub-carrier signal from standing out by interleaving the chroma signal and luminance signal.

The transmitting apparatus 10 on the transmission side is constituted by a clock generator 12, a digital video tape recorder (VTR) 14, a residual time stamp (RTS) generator 16, and a transmitting apparatus (TX) 18.

The clock generator 12 generates the internal clock $4f_{sc}$ of 14.3 MHz used in the transmitting apparatus 10 by using for example a crystal oscillator and supplies the same to the digital video tape recorder 14, the residual time stamp generator 16, and the transmitting apparatus 18.

The digital video tape recorder 14 records and reproduces the digital audio and video data of the D2 standard in synchronization with the internal clock $4f_{sc}$ and outputs the result to a 143 Mbps serial type transmitting apparatus 18 by the SDI system or serial digital data interface (SDDI) system of the standard of Sony Corporation (hereinafter, referred to as the SDDI system).

The residual time stamp generator 16 generates the synchronization data RTS used for establishment of synchronization between the transmitting apparatuses 10 and 30.

Figure 2:
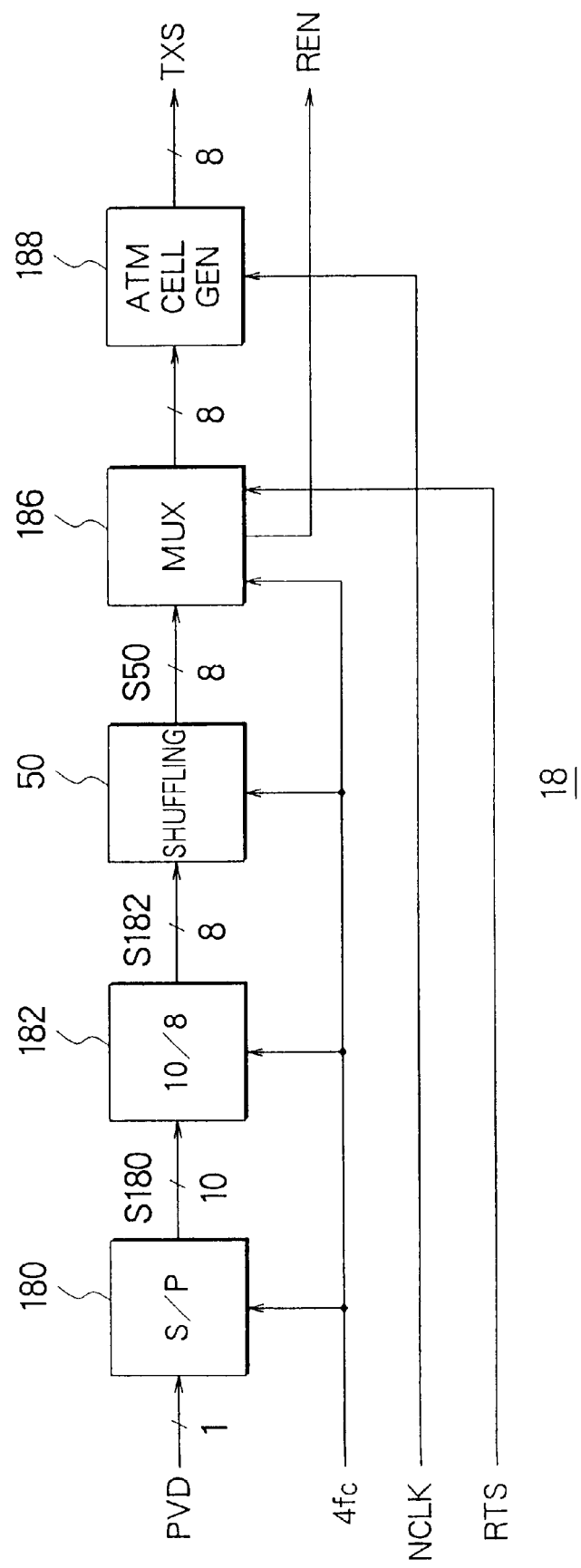
FIG. 2 is a view of the configuration of a transmitting apparatus shown in FIG. 1.

FIG. 2 is a view of the configuration of the transmitting apparatus 18 shown in FIG. 1.

The transmitting apparatus 18 is constituted by a serial/parallel converting circuit (S/P converting circuit) 180, a word width converting circuit (10/8) 182, a shuffling circuit 50, a multiplexing circuit (MUX) 186, and an ATM cell generating circuit 188, multiplexes the synchronization data RTS input from the residual time stamp generator 16 and the audio and video data PVD input from the digital video tape recorder 14 in a predetermined transmission packet (refer to FIG. 13), and transmits the same via the ATM communication line 20 to the transmitting apparatus 30 on the reception side.

The serial/parallel converting circuit 180 converts the audio and video data PVD input by the SDI system or SDDI system to 10 bit-parallel data and outputs the same to the word width converting circuit 182.

The word width converting circuit 182 converts the 10 bit-parallel data to the 8 bit-parallel data S182 adapted to the ATM system by a predetermined method and outputs the same to the shuffling circuit 50.

Figure 3:
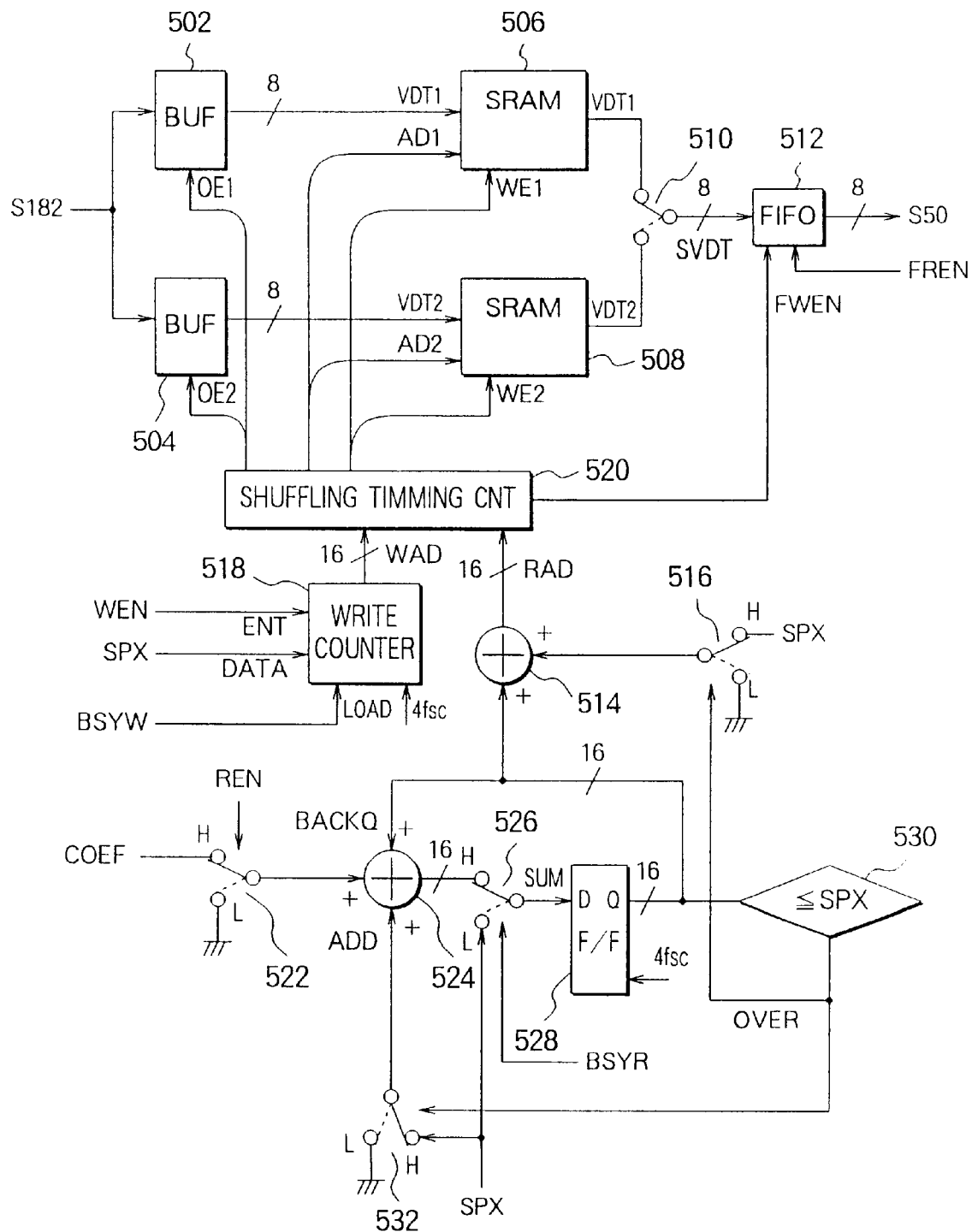
FIG. 3 is a view of the configuration of a shuffling circuit shown in FIG. 2.

FIG. 3 is a view of the configuration of the shuffling circuit 50 shown in FIG. 2.

Figure 4:
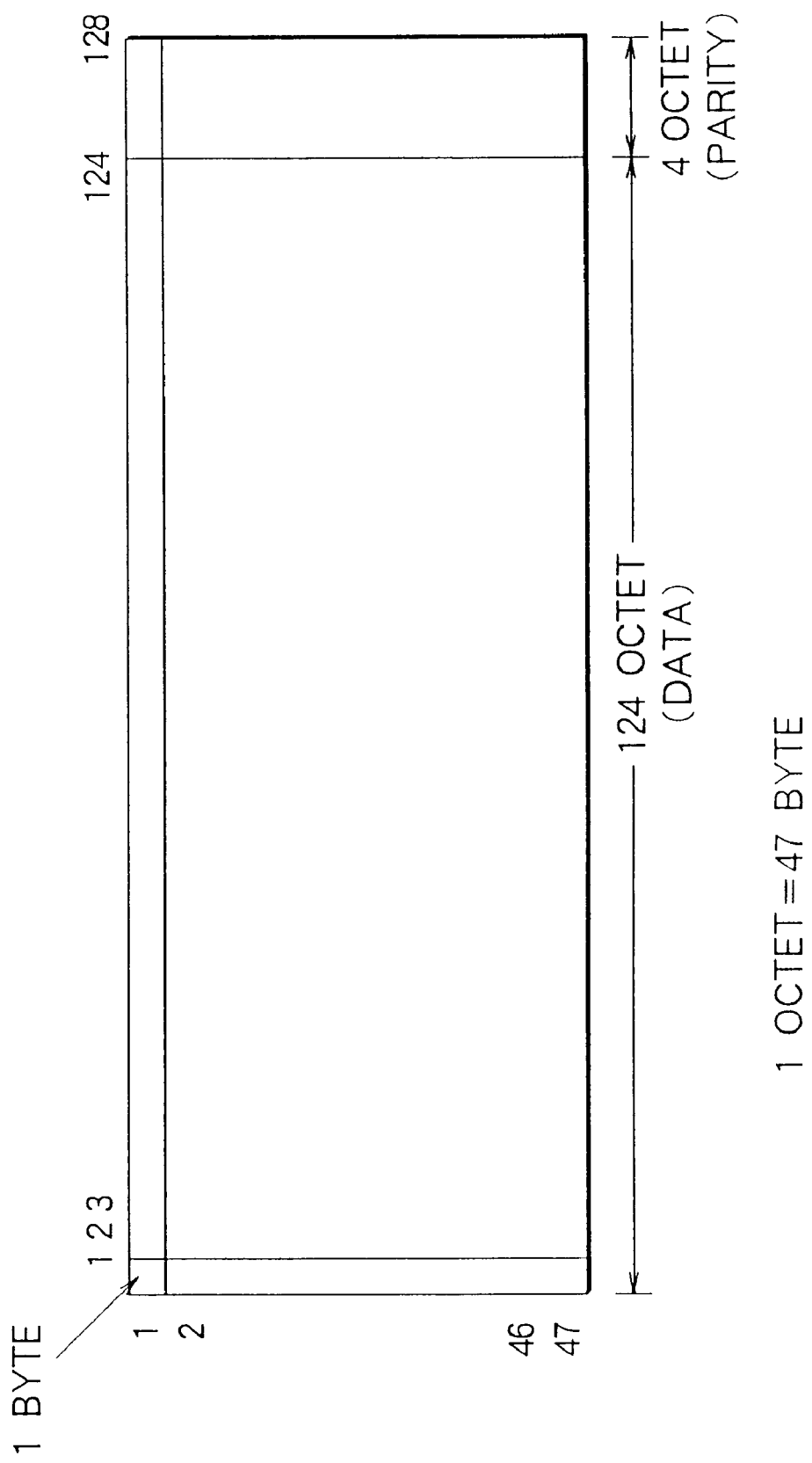
FIG. 4 is a view of the configuration of a block for a long interleave ECC where an ATM adaptation layer 1 protocol is used.

FIG. 4 is a view of the configuration of the block for a long interleave error correction code (ECC) where an ATM adaptation layer 1 (AAL1) protocol is used.

FIGS. 5A to 5J to FIGS. 8A to 8L are views showing the operational timing of the shuffling circuit 50 shown in FIG. 3, in which signal names give to the respective figures correspond to the signal names given in FIG. 3; FIGS. 6A to 6K are views enlarging the range a of FIGS. 5A to 5J; and FIGS. 8A to 8L are views enlarging the range a of FIGS. 7A to 7G.

As shown in FIG. 3, the shuffling circuit 50 is constituted by buffer circuits (BUF) 502 and 504, memory circuits 506 and 508 of a static random access memory (SRAM) of a 128K word×8 bit for example the HM628127H made by Hitachi Ltd., switch circuits 510, 516, 522, 526, and 532, a first-in first-out (FIFO) circuit 512, adder circuits 514 and 524, a write counter circuit 518, a shuffling timing control circuit 520, a latch circuit flip-flop (F/F) 528, and a switch control circuit 530. The shuffling circuit 50 shuffles the 8 bit-parallel data S182 and outputs the same as the shuffled data S50 taking a block configuration shown in FIG. 4 to the multiplexing circuit 186.

Figure 5:
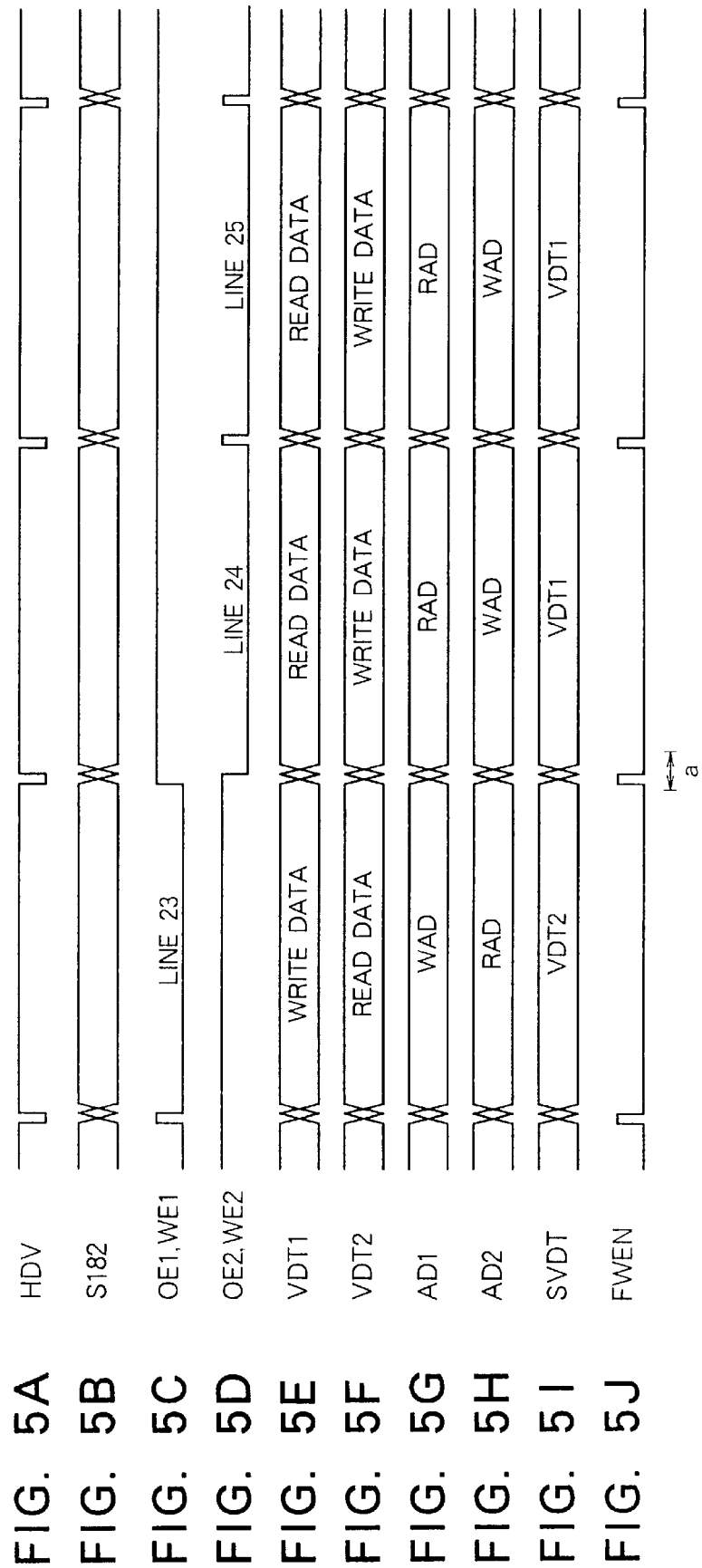
FIGS. 5A to 5J are views of an operational timing of the shuffling circuit shown in FIG. 3.
Figure 6:
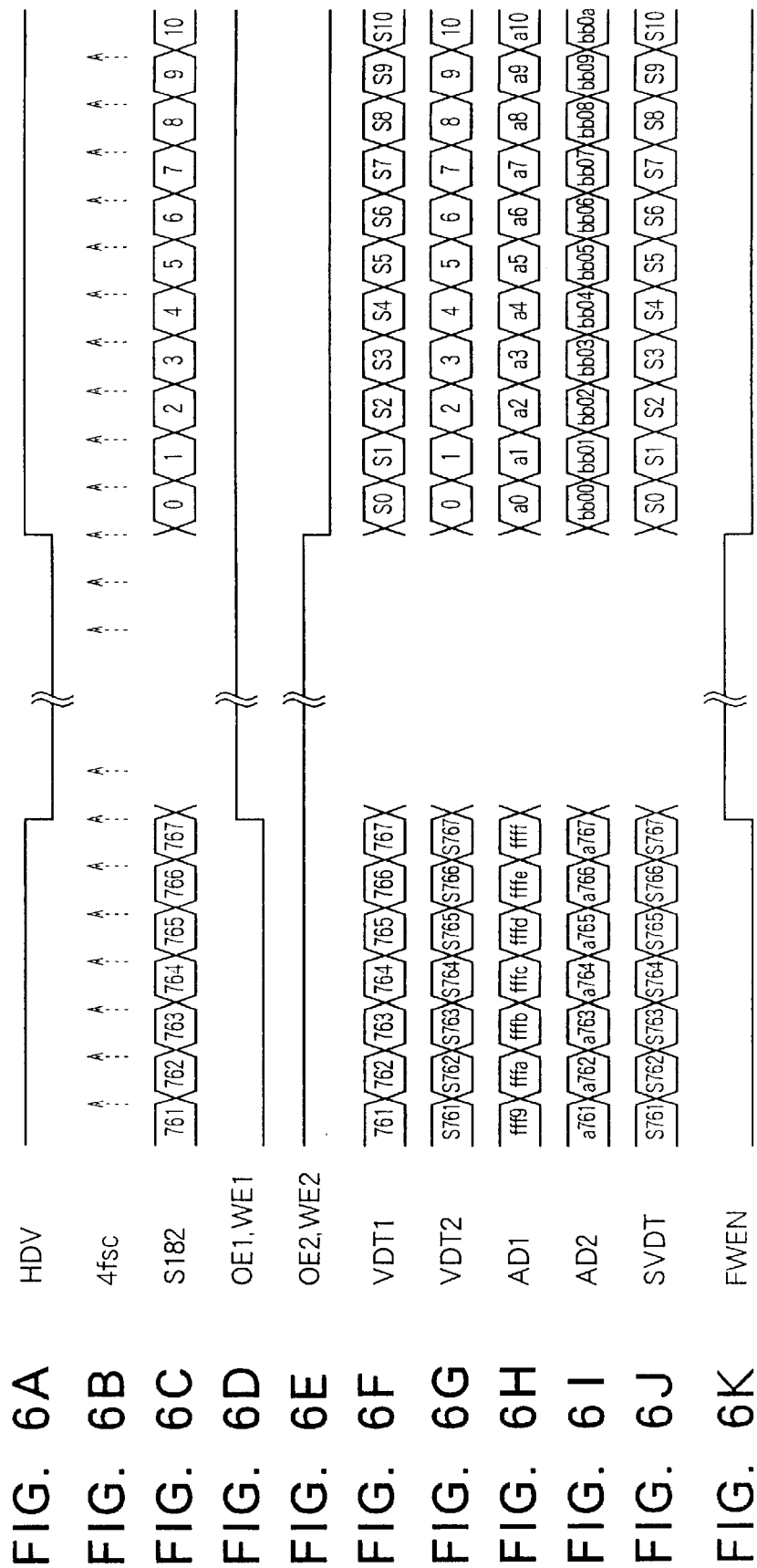
FIGS. 6A to 6K are views of the operational timing of the shuffling circuit shown in FIG. 3 and is a view enlarging the portion of the range a shown in FIGS. 5A to 5J.

The 8 bit-parallel data S182 shown in FIG. 5B and FIG. 6C are successively input to the buffer circuits 502 and 504 of the shuffling circuit 50 in synchronization with the horizontal synchronization signal HDV shown in FIG. 5A and FIG. 6A in synchronization with the internal clock signal $4f_{sc}$ shown in FIG. 6B and are buffered.

The shuffling timing control circuit 520 outputs output enable signals OE1 and OE2, a write address WAD, and a read address RAD to the buffer circuits 502 and 504 and the memory circuits 506 and 508 at timings shown in FIGS. 5C, 5D, 5G, and 5H, respectively.

The buffer circuits 502 and 504 alternately output buffered 8 bit-parallel data VDT1 and VDT2 to the memory circuits 506 and 508 at the timing indicated in FIG. 6F and FIG. 6G and FIG. 5E and FIG. 5F as the write data where the output enable signals OE1 and OE2 respectively shown in FIGS. 5C and 5D and FIGS. 6D and 6E are activated (logical value: 0).

The memory circuits 506 and 508 store the 8 bit-parallel data VDT1 and VDT2 input from the buffer circuits 502 and 504 at addresses indicated by the write address WAD of the addresses AD1 and AD2 shown in FIGS. 5G and 5H and FIGS. 6H and 6I where the write enable signals WE1 and WE2 respectively shown in FIGS. 5C and 5D and FIGS. 6D and 6E are activated (logical value: 0), respectively.

This write address WAD is output from the shuffling timing control circuit 520 to the memory circuits 506 and 508 during the period when the write enable signals WE1 and WE2 are activated (logical value: 0) as shown in FIGS. 5C to 5H. As shown in FIGS. 6H and 6I, the 8 bit-parallel data VDT1 and VDT2 respectively input from the buffer circuits 502 and 504 are generated so as to be stored in the order of the input on the most significant side address side (bb00h to ffffh, where, h indicates hexadecimal) so that they are packed at the back.

Further, the memory circuits 506 and 508 alternately output the data indicated by the read address RAD (a1, a2, ... a767) of the addresses AD1 and AD2 shown in FIGS. 5G and 5H and FIGS. 6H and 6I as the 8 bit-parallel data VDT1 and VDT2 (S1, S2, ..., S767) to the switch circuit 510 when the enable signals WE1 and WE2 become inactive (logical value: 1), respectively. In this stage, the 8 bit-parallel data output from the memory circuits 506 and 508 are in the shuffled state.

As shown in FIG. 6I and FIG. 6J, the switch circuit 510 selects the 8 bit-parallel data VDT2 of the memory circuit 508 during a period when the write enable signal WE1 is activated, selects the 8 bit-parallel data VDT1 of the memory circuit 506 during a period when the write enable signal WE2 is activated, and outputs the same as the selected data SVDAT to the FIFO circuit 512.

The FIFO circuit 512 successively stores the selected data SVDAT during a period when the write enable signal FWEN shown in FIG. 5J and FIG. 6K is activated (logical value: 0) and successively outputs the same as the shuffled data S50 when the read enable signal FREN input from the multiplexing circuit 186 is activated.

Below, an explanation will be made of the processing for generation of the read address RAD and the write address WAD of the addresses AD1 and AD2.

Figure 7:
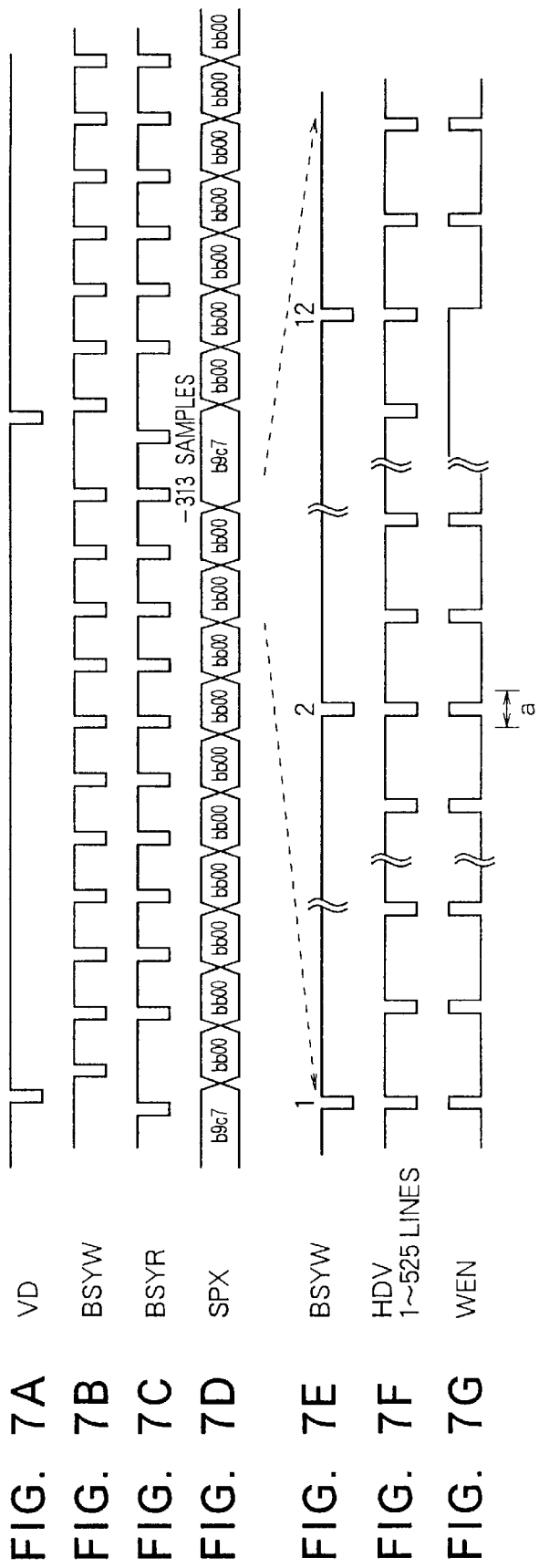
FIGS. 7A to 7G are views of the operational timing of the shuffling circuit shown in FIG. 3.

The write counter circuit 518 has a predetermined relationship with the synchronization signal VD shown in FIG. 7A, counts up a loaded offset value SPX in synchronization with the internal clock $4f_{sc}$ at a timing of loading the offset value SPX (least significant side address of the data stored in the memory circuits 506 and 508=bb00h) in the write counter circuit 518, that is, during a period when the offset value SPX is loaded in synchronization with a synchronization signal BSYW (FIGS. 7B and 7E and FIG. 8A) defining the number of the lines to be subjected to the shuffling processing among the lines constituting the video, and the write enable signal WEN input from the video tape recorder apparatus 182 shown in FIG. 7G is activated (logical value: 0), and outputs the same to the shuffling timing circuit 520.

Note that, the synchronization signal BSYW is used for storing the data in the shuffling memory by the relationship with the synchronization signal VD.

Note that, in the present embodiment, the shuffling circuit 50 is constituted so as to perform the processing by dividing the video data of the odd number fields into 23 lines×10 unit blocks+313 samples and dividing the video data of the even number fields into 23 lines×10 unit blocks+23 lines. For this reason, as shown in FIG. 7D, when processing the 11th unit block of the odd number fields, a value (b9c7h) obtained by subtracting 313 from the usual offset value SPX (=bb00h) is loaded in the counter circuit 518 as the offset value SPX.

The switch circuit 522 selects the contact point H during a period when the read enable signal REN is activated and selects the contact point L during a period when it is inactive and outputs the shuffling coefficient COEF (4717 (126 dh) in the present embodiment) or the numerical value 0 to the input terminal of the adder circuit 524.

The switch control circuit 530 compares the numerical value BACKQ input from the latch circuit 528 with the offset value SPX, makes the control signal OVER shown in FIG. 7J inactive (logical value: 1) where the numerical value BACKQ is the offset value SPX or less, while makes this active (logical value: 0) in cases other than this, and controls the switch circuits 516 and 532.

The switch circuits 516 and 532 select the contact point H side and output the offset value SPX to the input terminal of the adder circuit 524 where the control signal OVER output from the switch control circuit 530 has become inactive (logical value: 1), while select the numerical value 0 and output the same to the input terminal of the adder circuit 524 in cases other than the former case.

Figure 8:
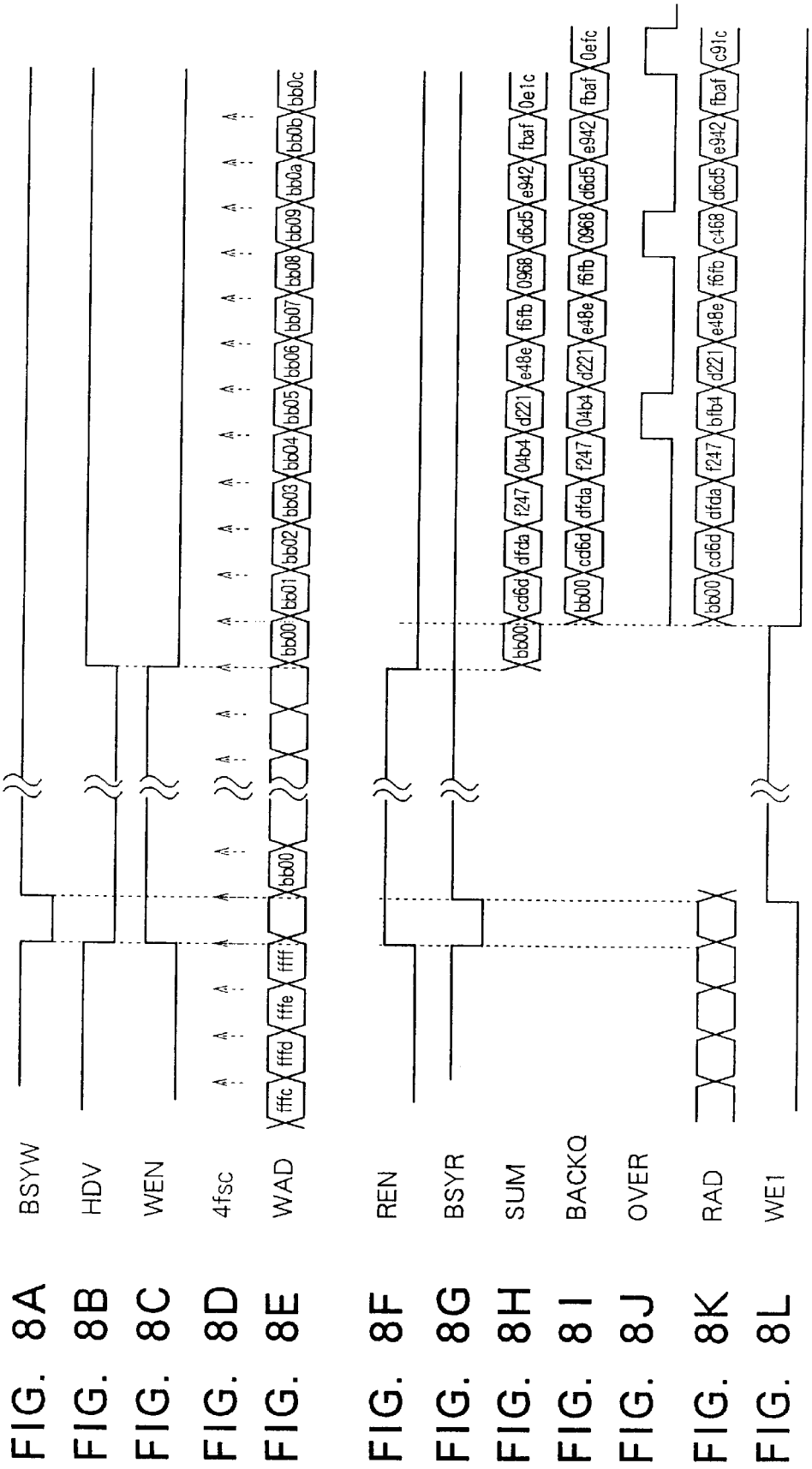
FIGS. 8A to 8L are views of the operational timing of the shuffling circuit shown in FIG. 3 and is a view enlarging the portion of the range a shown in FIGS. 7A to 7G.

The adder circuit 524 adds the numerical value input from the switch circuit 522, the numerical value input from the switch circuit 532, and the numerical value BACKQ input from the latch circuit 528 and outputs the lower 16 bits of the result of addition to the contact point L of the switch circuit 526 as the sum SUM shown in FIG. 8H.

The adder circuit 514 adds the numerical value input from the switch circuit 516 to the numerical value BACKQ and outputs the result to the shuffling timing circuit 520 as the read address RAD shown in FIG. 8K.

The read address RAD calculated by the adder circuit 514 is output via the shuffling timing circuit 520 to the memory circuits 506 and 508 as shown in FIGS. 5G and 5H.

The switch circuit 526 selects the contact point H and outputs the sum SUM to the latch circuit 528 when the synchronization signal BSYR shown in FIG. 7C and FIG. 8G has become inactive (logical value: 1), that is, when the 8 bit-parallel data VDT1 and VDT2 are read from the memory circuits 506 and 508, and selects the contact point H and outputs the offset value SPX to the latch circuit 528 in cases other than this case.

The latch circuit 528 holds the numerical value BACKQ input from the switch circuit 526 in synchronization with the internal clock $4f_{sc}$ shown in FIG. 8D and outputs the same to the switch control circuit 530 and the input terminals of the adder circuits 514 and 524.

During a period when the write address WAD is generated in the order shown in FIG. 8E and the write enable signal WEN shown in FIG. 8C is activated, the 8 bit-parallel data VDT1 and VDT2 are successively stored in the memory circuits 506 and 508 in the input order.

Further, during a period when the read enable signal REN shown in FIG. 8F is activated, the respective constituent portions of the shuffling circuit 50 successively add the shuffling coefficient COEF to the offset value SPX for every internal clock $4f_{sc}$ and output the value obtained by adding the offset value SPX to the result of addition as the read address RAD to the shuffling timing circuit 520 where the value of the lower 16 bits of this addition result is less than the offset value SPX.

Further, since the latch circuit 528 outputs only the lower 16 bits, consequently the value of the read address RAD becomes the value obtained by further adding the offset value SPX to the value of the remainder system of the value obtained by successively adding the shuffling coefficient COEF for the offset value SPX to the offset value SPX.

In this way, the value of the read address RAD must be generated because memory circuits having different capacities from the number of the unit blocks are used as the memory circuits 506 and 508. For example, when the size of the unit blocks is made constant and memories having storage capacities equal to the size of the unit blocks are used as the memory circuits 506 and 508, the processing regarding the offset value SPX becomes unnecessary.

As explained above, in the shuffling circuit 50, a read address RAD changed in order from that of the write address WAD by computation is generated and the data are successively read from the addresses of the memory circuits 506 and 508 indicated by this read address RAD so as to carry out the shuffling.

This read address RAD is found from the number of lines of the video contained in a unit block and the shuffling coefficient COEF.

Figure 9:
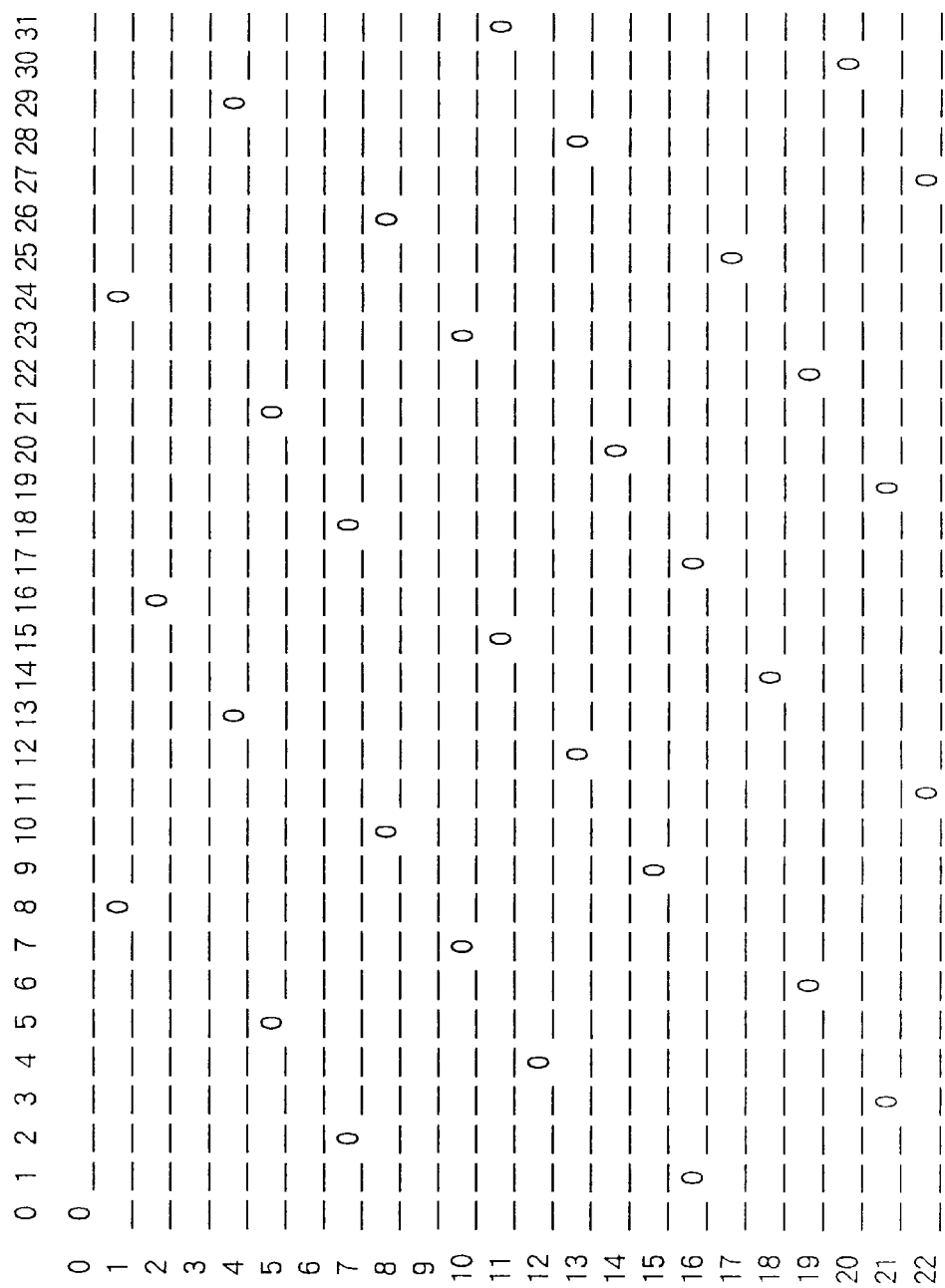
FIG. 9 is a view exemplifying an arrangement of video data after the shuffling by the shuffling circuit shown in FIG. 3.

For example, as shown in the present embodiment, where 23 lines are defined as a unit block and the shuffling coefficient COEF is set to 4717 (126 dh), when the video data after the shuffling are arranged in correspondence to the original video data, each sample of the line 0 before the shuffling is shuffled to the position indicated by "0" in FIG. 9.

Where the data after the shuffling shown in FIG. 9 in which all of the data of the 0-th to sixth lines (corresponding to one block shown in FIG. 4) are destroyed are returned to their original order, they are at the positions indicated by "0" to "6" in FIG. 10. As shown in FIG. 10, for the data shuffled in the shuffling circuit 50, concealment of error using the image data of two pixels of the two sides of the pixel in which the error is generated (two pixels each on the two sides in the lateral direction) and the pixel data of the corresponding pixels of the two sides (two pixels each on the two sides in the vertical direction) is possible even in a case where all of the data contained in one block shown in FIG. 4 are in error.

As shown in the present embodiment, in order to find the number of lines included in the unit block and the optimum shuffling coefficient COEF, for example a program shown below and executed by a general computer is used:

TABLE 1

```
# include     <stdio.      h>
# define      START        0
# define      WIDTH        16
# define      PIXEL        768
main ()
{
FILE    *infile, *outfile;
unsigned long int a, b, c, d, e, b, v, 1c, hc, cc, 1b,
hb, bb:
    long int    w[0x40] [0x30]:    //Two-dimensional shuffling
                                     sample
    int         PRIM;               // Shuffling coefficient
    int         FLAG,i;
    int         DISTANCE;
    int         LINE;
    int         n;
    while (1) {
       printf ("LINE? /n/0");// Set number of lines
                                for shuffling
       scanf ("%3d", &LINE);
       printf ("DISTANCE?/n/0");// Line distance until
                                  sample to be used in
                                  concealment becomes error
       scant ("%3d", &DISTANCE);
       if (DISTANCE == 0) break;
       for (i = 5; i < 5500;i++) {// Set maximum value of
                                    shuffling coefficient to
                                    less than 6500*2
    PRIM = 2*1 + 1;
    FLAG = 0;
```

TABLE 1-continued

```
    for (a = 0; a < PIXEL*LINE; a++)   {
       h = (START + PRIM * a) % PIXEL;
       v = ((START + PRIM * a)/PIXEL) % LINE;
       w [v] [h] = 99;   // Set maximum value of
                            shuffling coefficient to
                            99
    for (a = 0; a < PIXEL*LINE; a++)   {
       h = (START + PRIM*a) % PIXEL;
       v = ((START + PRIM * a) / PIXEL) % LINE;
       if(w [v] [h] = 99) w [v] [h] = a /PIXEL;
       else {
FLAG = 1;
break;
}                   // Test if PRIM becomes
                        all pixel shuffling in
                        all shuffling regions
    }
    for (a = 0; a < PIXEL*LINE; a++) (
       h = (START + PRIM*a) % PIXEL;
       v = ((START + PRIM * a) / PIXEL) % LINE;
    for (a = 0; a < PIXEL*DISTANCE; a++)   {
       h = (START + PRIM*a) % PIXEL;
       v = ((START + PRIM * a) / PIXEL) % LINE;
       w [v] [h] = a / PIXEL;// arrangement by
                                shuffling coefficient
                                of lines from 0 to
                                DISTANCE
    }
for (a = 0; a < PIXEL*LINE ; a++)   {
    if (FLAG) break;
    b = n/PIXEL;
    c = a%PIXEL;
    if (w [b] [c] 1 = 99) { // Inspection of
                               DISTANCE amount of
                               samples arranged in
                               space in horizontal
                               direction (4 samples)
if (c > 3)     1c = c-4;
   else if (c > 2)    1c = c-3;
   else if (c > 1)    1c = c-2;
   else if (c > 0)    1c = c-1;
   else   1c = 0
if (c < 764)     hc = c+4
   else if (c < 765)    hc = c+3;
   else if (c < 766)    hc = c+2;
   else if (c < 767)    hc = c+1;
   else   hc = PIXEL-1;
      for (cc = 1c; cc < (hc+1) ; cc++)   {
   if (c 1 = cc)
      if (w [b] [cc] 1 = 99)
        FLAG = 1;        // Flag is set where data
                             has been already set
    }
    if ( | FLAG)    {      // Inspection of vertical
                              direction
          if (b<0)     1b = b-1;
          else        1b = 0;
          if (b<(LINE-1)   hb = b+1;
          else         hb = LINE - 1;
          for (bb = 1b; bb < (hb+1) ; bb++)   {
             if (b1 = bb)
                if (w [bb] [c] 1 = 99)   {
                   FLAG = 1;
                }
             }
          }
       }
    }
    if ( | FLAG)
       printf ("%5d",PRIM);// PRIM cmeeting inspection
                              heretofore becomes
                              shuffling coefficient
    }
  }
}
```

Figure 11:
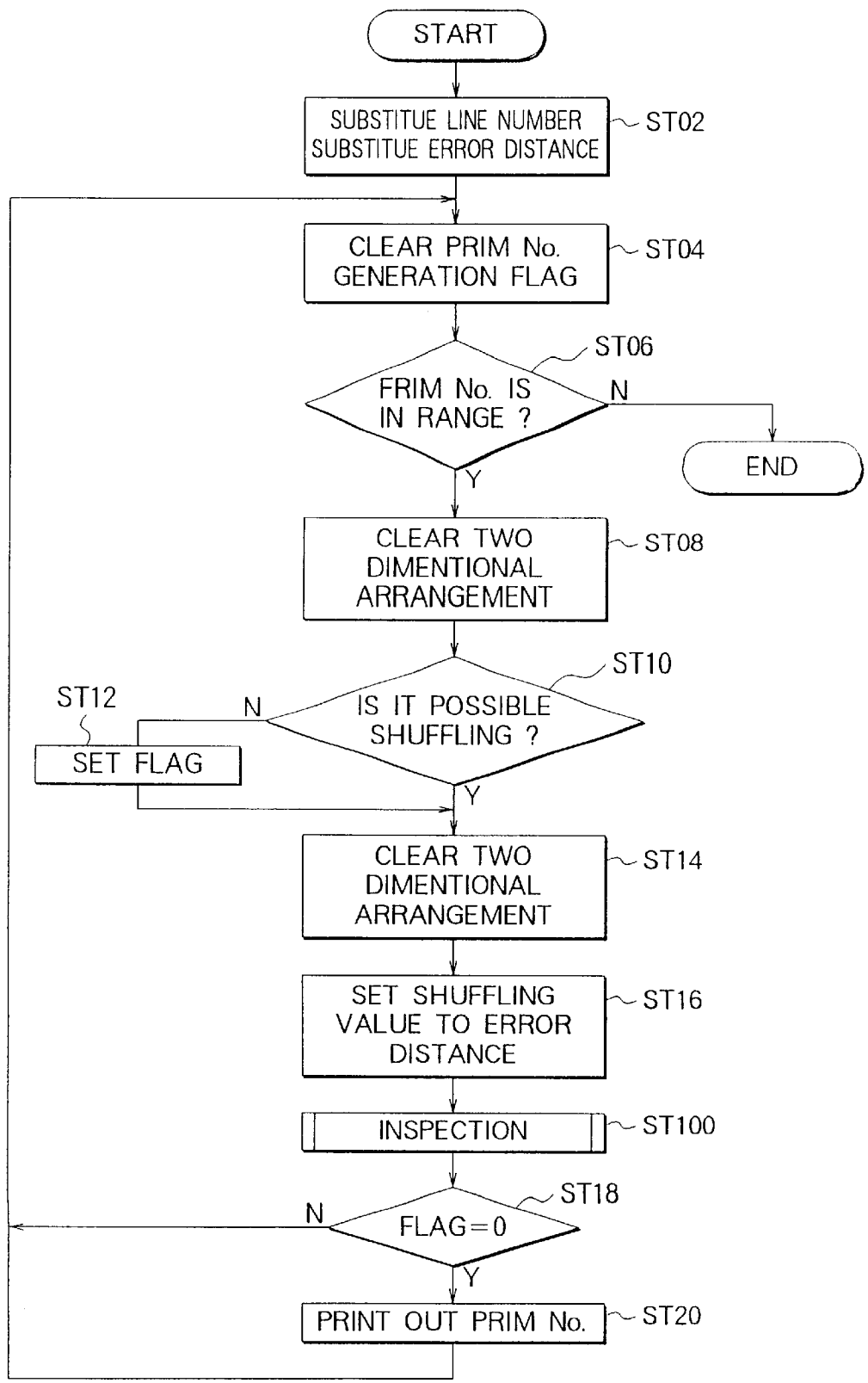
FIG. 11 is a flow chart of the operation of the program shown in Table 1.

FIG. 11 is a flowchart showing the operation of the program shown in Table 1.

Figure 12:
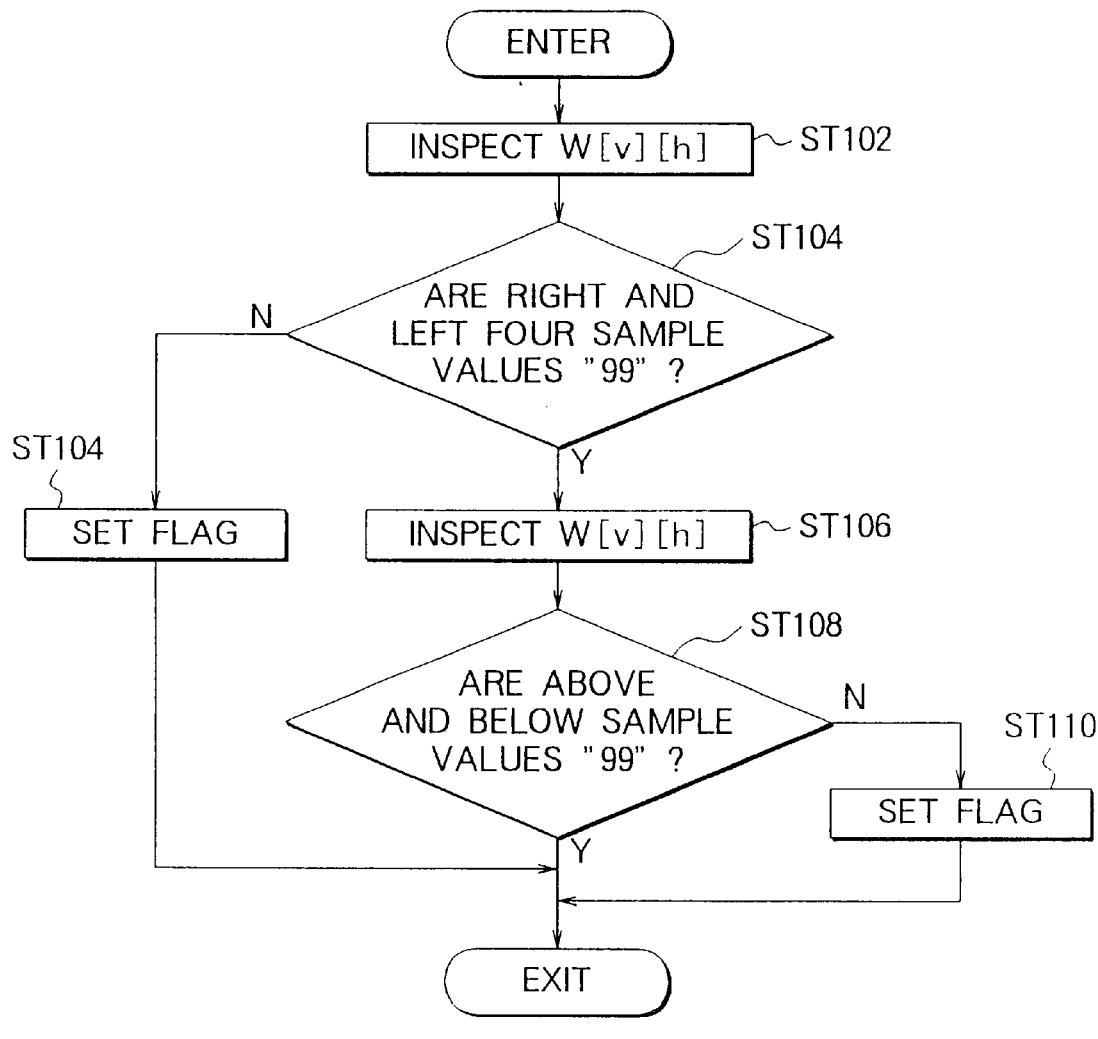
FIG. 12 is a flow chart of the operation of step 100 shown in FIG. 11.

FIG. 12 is a flowchart showing the operation of step 100 shown in FIG. 11.

As shown in FIG. 11 and FIG. 12, at step 02 (ST02), the number of lines constituting the unit block and the error distance (number of pixels in which the error is not generated which should be secured in the lateral direction and the vertical direction where a data error is generated in seven successive lines after shuffling, for example, four in the lateral direction (2 on right+2 on left) and two in the vertical direction (upper one+lower one) are assigned.

At step 04 (ST04), the PRIM number is generated and a variable FLAG is cleared.

Here, the PRIM number is the number indicating the shuffling coefficient, and the variable FLAG is the flag used for the control at the execution of the program.

At step 06 (ST06), it is decided whether or not the PRIM number is within the expected search range.

When the PRIM number is within the search range, the operational routine proceeds to the processing at step 08, and when it is out of the search range, the processing is ended. Note that, the search range is 0 to (all samples—1), but in actuality, it is sufficient so far as the search is made from 0 to (all samples/2).

At step 08 (ST08), the value (two-dimensional array) of the video data of the pixels (two-dimensional array) to be searched is cleared (numerical value "99" is assigned).

At step 10 (ST10), it is decided whether or not the shuffling is possible. Where the shuffling is possible, that is, the above shuffling coefficient COEF is successively added to the offset value SPX, if the values of the remainder system thereof do not overlap, the operational routine proceeds to step 14, and if it is impossible, the operational routine proceeds to the processing of step 14.

At step 12 (ST12), the variable FLAG is set.

At step 14 (ST14), the value of the video data of the two-dimensional array is cleared.

At step 16 (ST16), the video data W [v] [h] (v=±1, h=±1, ±2; the video data W [0] [0] is the video data to be inspected) which become pixels existing in an error distance after shuffling (in the example shown in step 02, left and right two pixels adjoining the pixel to be inspected and one pixel above and beneath the same) is found by the same method as that for the shuffling circuit 50 with respect to one pixel after shuffling to be inspected, and the operational routine proceeds to the processing of step 100 shown in FIG. 12.

At step 102 (ST102), the inspection of the video data W [v] [h] is carried out. That is, it is decided whether or not the video data contained in seven successive lines containing the line in which one pixel after the shuffling is contained to be inspected is contained within a range of the video data W [0] [±1, ±2], the value of the video data not contained in this range is held at [99] as it is, and the value of the video data other than this is changed to the video data other than "99".

At step 104 (ST104), it is decided whether or not the value of the video data W [0] [±1, ±2] is "99", that is, whether or not each 2 bits on the left and right of the pixel to be inspected are in a state indicated as "-" in FIG. 10. Where it is "99", the operational routine proceeds to the processing of step 106, and where it is not "99", the operational routine proceeds to the processing of step 104. At step 106 (ST106), the inspection of the video data W [v] [h] is carried out. That is, it is decided whether or not the video data contained in seven successive lines containing the line in which one pixel after the shuffling is contained to be inspected is contained within a range of the video data W [±1] [0], the value of the video data not contained in this range is held at [99] as it is, and the value of the video data other than this is changed to video data other than "99".

At step 108 (ST106), it is decided whether or not the value of the video data W [±1] [0] is "99", that is, whether or not one bit each above and beneath the pixel to be inspected is in the state indicated as "-" in FIG. 10. Where it is "99", the operational routine proceeds to the processing of step 106, and where it is not "99", the operational routine proceeds to the processing of step 104.

At step 104 (ST104) and step 110 (ST110), the variable FLAG is set.

After the respective processings included in the above step 100 are ended, the operational routine proceeds to the processing of step 18 (FIG. 11).

At step 18 (ST18), where the variable FLAG=0, that is, in the inspection at steps 104 and 110, where the video data contained in seven successive lines containing the line in which one pixel after the shuffling is contained to be inspected is not detected within the range of the video data W [v] [0], the operational routine proceeds to the processing of step 20. In cases other than this, the operational routine proceeds to the processing of step 04.

At step 20 (ST20), the PRIM number (shuffling coefficient COEF) and the number of lines contained in the unit block are printed out with a predetermined format.

When the program shown above is executed while changing the number of lines contained in the unit block and the error distance as described above, for example, the result shown below is obtained:

TABLE 2

(2-1) Number of lines in unit block: 23

| COEF | Number of line which can be concealed | Error distance (left and right) |
|---|---|---|
| 12011 | 7 | 2 |
| 4713* | 7 | 2 |
| 4717** | 7 | 2 |

Note, the single asterisk (*) indicates the case of the odd number field (configuration of 23 lines × 11 + 313 samples), and the double asterisks (**) indicate the case of the odd number field (23 lines × 11).

(2-2) Number of line of unit blocks: 25

| COEF | Number of lines which can be concealed | Error distance (left and right) |
|---|---|---|
| 6641** | 8 | 2 |
| 7351** | 8 | 2 |
| 3461* | 8 | 2 |

Note, the single asterisk (*) indicates the case of the odd number field (configuration of 23 lines × 11 + 313 samples), and the double asterisks (**) indicate the case of the odd number field (23 lines × 11).

(2-3) Number of lines of unit block: 31

| COEF | Number of line which can be concealed | Error distance (left and right) |
|---|---|---|
| 5087 | 7 | 3 |

Note, this indicates the case of the configuration of 31 lines × n.

(2-4) Number of lines of unit block: 32

| COEF | Number of line which can be concealed | Error distance (left and right) |
|---|---|---|
| 7741** | 8 | 2 |
| 7261* | 8 | 2 |

Note, the single asterisk (*) indicates the case of the odd number field (configuration of 23 lines × 11 + 313 samples), and the double asterisks (**) indicate the case of the odd number field (23 lines × 11).

Note that, by using the program shown above, other than the shuffling coefficients COEF shown above, shuffling coefficients can be found for any number of lines of the unit block and any error distance.

The number of lines of the unit block is preferably selected so that the dummy data to be added is reduced as much as possible when the video data after the shuffling are arranged in the block shown in FIG. 4 etc.

Figure 13:
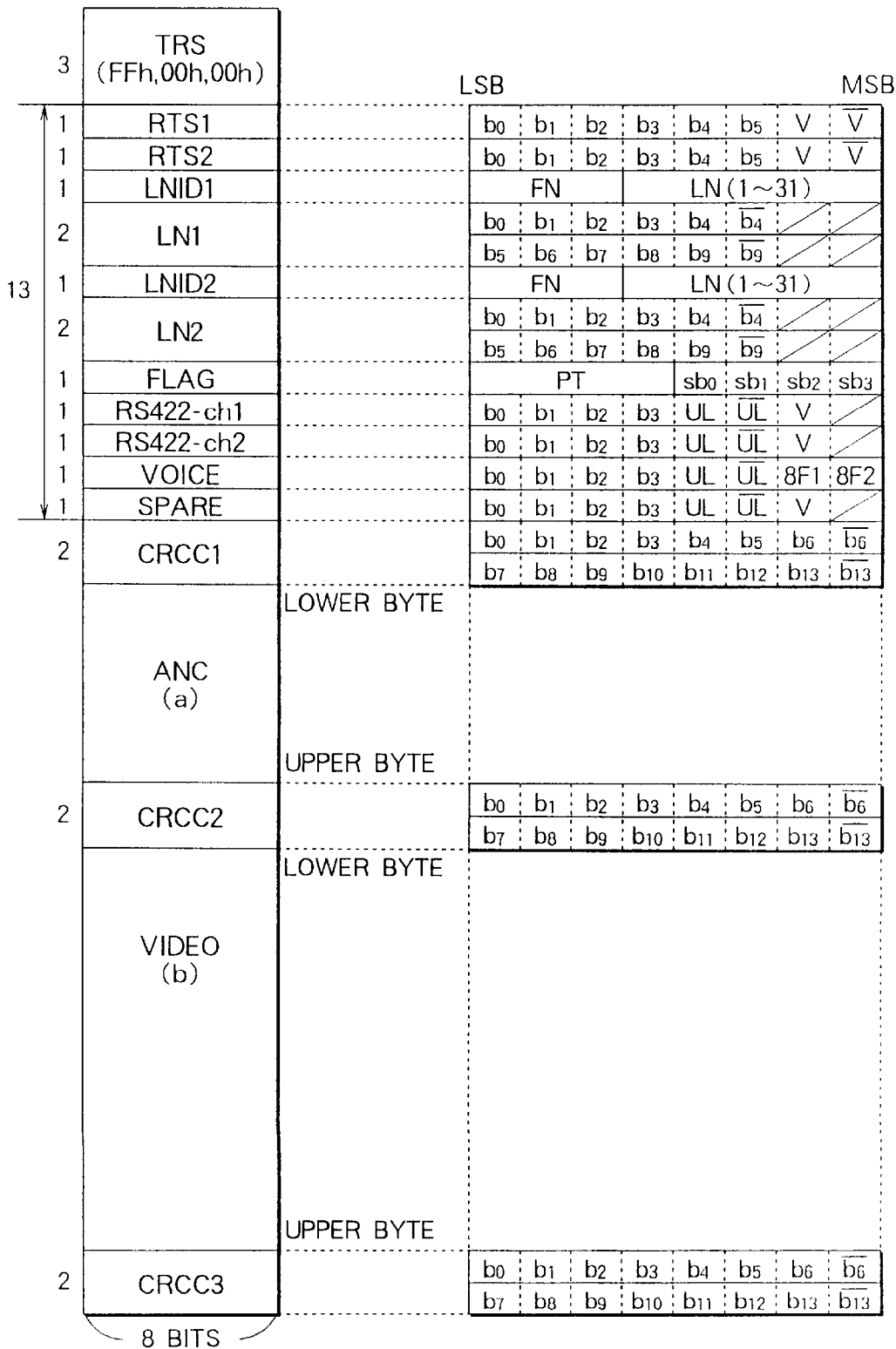
FIG. 13 is a view of the configuration of a transmission packet (PDU packet) generated by a multiplexing circuit shown in FIG. 2.

FIG. 13 is a view of the configuration of a transmission packet (SSCU-PDU packet, hereinafter referred to as "PDU packet") generated by the multiplexing circuit 186 shown in FIG. 2. Note that, the numerals added to the left of the PDU packet indicate the byte length of each data, and the table added to the right of the PDU packet indicates the contents of the corresponding respective data.

The multiplexing circuit 186 multiplexes the shuffling data S50 and the value obtained by subtracting the numerical value 832 from the synchronization data RTS input from the residual time stamp generator 16 in the predetermined transmission packet (PDU packet) shown in FIG. 13 and outputs the result as the multiplexed data to the ATM cell generating circuit 188.

The data generated by the multiplexing circuit 186, converted to the ATM cell, and transmitted to the ATM communication line 20 is multiplexed in the PDU packet shown in FIG. 13.

In the PDU packet, the data TRS has the content of FFh, 00h, and 00h and indicates the leading position of the PDU packet. Note that, in the data TRS and ancillary (ANC) region and the video data (VIDEO) region, except the data inserted at intervals of 5 bytes, it is prohibited that the data contained in the PDU packet take the value of 00h or FFh.

The synchronization data RTS generated by the residual time stamp generator 16 is inserted into the data RTS1 and RTS2. This synchronization data RTS is a value of 6 bits obtained by subtracting the value of 832 from the counted value of the external clocks NCLK by the internal clock $4f_{sc}$ for 1188 cycles. Note, the transmission packet is transmitted for a time worth 910 cycles of the internal clock $4f_{sc}$, therefore there is a possibility that two count values will appear during the transmission of one transmission packet. Two regions of the data RTS1 and RTS2 are secured so as to cope with such a case.

The data RTS1 and RTS2 are used for the establishment of the net synchronization in the transmitting apparatus 10 on the reception side. Note that, a valid bit V (Valid) is placed in the sixth bit of the data RTS1 and RTS2. The content of the valid bit V becomes the logical value 1 where for example these data are valid and becomes the logical value 0 where they are not valid. Further, in order to avoid the value of the data from becoming 00h, FFh, a logic inverted value of the valid V is added as the seventh bit.

The data LNID (Line Number ID) 1 is used for the identification of the audio and video data contained in the ancillary data region and the video data region in the same PDU packet, the 0th to second bit indicate the field number (FN) indicating the field in which the audio and video data are contained, and the third to seventh bits taking the values of 0 to 31 indicate the line number (LN) indicating the line in which the audio and video data are contained.

The data LN1 takes a value within a range of from 1 to 525 and is used for the identification of the audio and video data (the audio data contained in this is not the audio for discussions) within the range of 2 fields together with the data LNID1. In the 0-th to fourth bits of the first byte and second byte of the data LN1 are respectively placed the 0th to fourth bits and fifth to ninth bits of the numerical value. The logic inverted value of the fourth bit is placed into each fifth bit for the same reason as that for the valid bit V of the data RTS1 and RTS2.

The data LNID2 and LN2 are used where the transmitting apparatus 3 on the transmission side performs the processing (advance compensation processing) for transmitting the audio and video data at a timing early in comparison with the audio and video data transmitted by an entire television broadcasting station on the transmission side so as to compensate for the synchronization of the audio and video data of the entire station such as the television broadcasting station in which the transmitting apparatus 3 on the reception side is used with the received audio and video data.

That is, the data LNID2 and LN2 indicate by how many lines the transmission timing for transmitting the audio and video data contained in the same PDU packet to the transmitting apparatus 3 on the reception was made earlier from the timing at which it should be originally transmitted in the television broadcasting station etc. on the transmission side. Note that, the specific contents of each of the data LNID2 and LN2 are the same as those of the data LNID2 and LN2 mentioned above, respectively.

Note that, by referring to the data LNID2 and LN2, the transmitting apparatus 3 on the reception side can identify the deshuffling method of the audio and video data contained in the ancillary data region and the video data region, etc. That is, among the audio and video data, the shuffling block (worth 23 lines) of the portion of the data regarding the video is determined from the data LNID2 and LN2, and the deshuffling is carried out for every such shuffling block.

In the data Flag, the packet table (PT) data indicating the amount of data of the ancillary data portion and the video data portion is placed into the 0th to third bits. The bits sb0 to sb3 enter into the fourth to seventh bits. These bits sb0 to sb3 are used for transferring the system of the shuffling on the encoder side.

The data RS422-ch1 and RS422-ch2 are used for the transmission of the data for control using the RS422 between the computers (not illustrated) respectively connected to for example the transmitting apparatuses 10 and 30 on the transmission side and the reception side, etc.

To the 0th to third bits of the data RS422-ch1 and RS422-ch2, either of the upper 4 bits or the lower 4 bits of the data to be transmitted enter, respectively. To the fourth bit, a bit UL (Upper/Lower) which becomes "1" where the data entering into the 0th to third bits is the upper 4 bits and becomes "0" where this data is lower 4 bits is entered. For the same reason as that for the valid bit V of the data RTS1 and RTS2, the logic inverted value of the fourth bit enters into the fifth bit.

Further, to the sixth bit, a valid bit V indicating whether or not the data RS422-ch1 and RS422-ch2 are respectively valid is added.

To the data VOICE, audio data used for the liaison etc. enters. The audio data is generated 8 bits at a time once per every 2 cycles of the horizontal synchronization signal (15.75 KHz) of the video signal so that sampling can be carried out by a sampling frequency almost equal to the sampling frequency of the PCM coding apparatus used in for example a general telephone communication and in addition it can be easily put in a PDU packet in terms of timing. Accordingly, one audio data will be transmitted over two PDU packets, one of which is generated every cycle of the horizontal synchronization signal. Note that, in the case shown in FIG. 13, the higher 4 bits or lower 4 bits of the audio data are put in the 0th to third bits of the data VOICE.

Further, in the fourth bit, similar to the data RS422-ch1 and RS422-ch2, the bit UL indicating whether the data of the 0th to third bits is the upper 4 bits or the lower 4 bits is placed. In the fifth bit, the logic inverted value of the fourth bit is placed for the same reason as that of the valid bit V of the data RTS1 and RTS2. Further, the valid bit V indicating whether or not the audio data is valid is added.

Further, in the sixth and seventh bits are placed the bits 8F1 and 8F2 (8F is an abbreviation of 8 Frame) used for measuring the delay time to be given to the PDU packet by the transmitting apparatuses 10 and 30 per se and the ATM communication line 20. Note that the data put in the data LNID2 and LN2 are calculated based on the delay time measured by using these bits 8F1 and 8F2.

The stand-by region is a region made empty to stand by for a case where another purpose occurs etc., but similar to the data RTS1 and RTS2, the logic inverted value of the sixth bit is placed in the seventh bit so that the value will become neither 00h nor FFh.

In the data CRCC1, CRCC2, and CRCC3, the error correction codes of the preceding data region are placed, respectively. Note that, similar to the data RTS1 and RTS2, the logic inverted value of the sixth bit is placed in the seventh bit so that the value will become neither 00h nor FFh.

In the ancillary data region, mainly the data regarding the audio is placed among the audio and video data of the video signal. Note that, the data for the audio takes the order of the lower byte in the front of the PDU packet and the upper byte in the back.

In the video data region, mainly the data regarding the video is placed among the audio and video data of the video signal. Note that, the data regarding the video takes the order of the lower byte in the front of the PDU packet and the upper byte in the back.

Note that, the ancillary data region and the video data region of the PDU packet have variable lengths and that there also exists a case where these regions do not contain valid data. Further, the data RS422-ch1, VOICE, etc. have the valid bit V, therefore this means that, for example, where only the valid data V of the data VOICE is "1" and the valid data V of the other data is "0", only the data VOICE is valid. The other data are all invalid.

The ATM cell generating circuit 188 converts the data multiplexed in the PDU packet shown in FIG. 13 to the ATM cell and outputs the same as the transmission data TXD to the ATM communication line 20.

The ATM communication line 20 (FIG. 1) transmits the data between the transmitting apparatuses 10 and 30 by the asynchronous transmission mode (ATM) system and, at the same time, supplies the line clock NCLK of 19.44 MHz to the transmitting apparatuses 10 and 30.

The transmitting apparatus 30 on the reception side is constituted by a receiving apparatus (RX) 32, a digital video tape recorder 34, a clock control apparatus 36, and a clock generator 38, receives the ATM cell transmitted from the transmitting apparatus 10, reproduces the internal clock $4f_{sc}$ in synchronization with the internal clock $4f_{sc}$ on the transmitting apparatus 10 side based on the synchronization data RTS and the line clock NCLK, demultiplexes the audio and video data from the PDU packet, and records the same.

Figure 14:
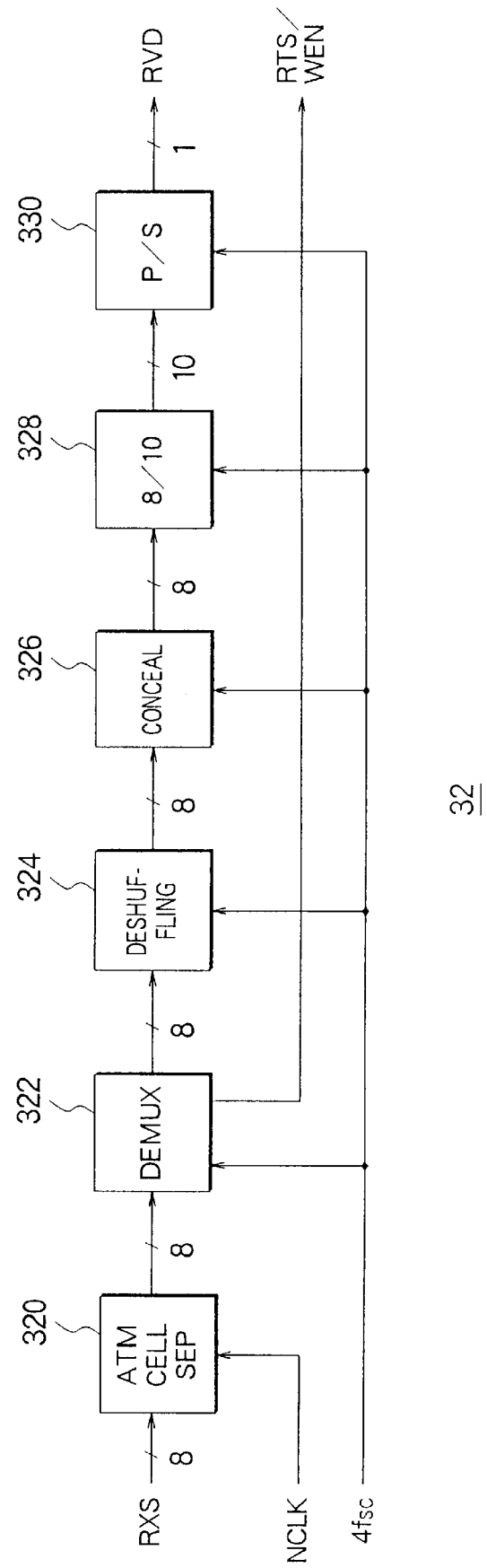
FIG. 14 is a view of the configuration of a receiving apparatus shown in FIG. 1.

FIG. 14 is a view of the configuration of the receiving apparatus 32 shown in FIG. 1.

As shown in FIG. 14, the receiving apparatus 32 is constituted by an ATM cell decomposing circuit 320, a demultiplexing circuit 322, a deshuffling circuit 324, a concealment circuit 326, a word width converting circuit 328, and a parallel/serial converting circuit (P/S converting circuit) 330.

The ATM cell decomposing circuit 320 receives the transmission data RXD (=TXD) transmitted from the transmitting apparatus 10 via the ATM communication line 20 by using the line clock NCLK, deletes an address portion of the ATM cell, etc., returns the form to that of the PDU packet shown in FIG. 13, and outputs the resultant data to the demultiplexing circuit 322.

The demultiplexing circuit 322 demultiplexes the synchronization data RTS from the PDU packet input from the ATM cell decomposing circuit 320 by using the internal clock $4f_{sc}$, adds the numerical value 832, and generates the synchronization data RTS of 12 bits and, at the same time, generates the write enable signal WEN indicating the timing of writing to the FIFO circuit 360 of the clock control apparatus 36 and outputs the same to the clock control apparatus 36.

Further, the demultiplexing circuit 322 demultiplexes the audio and video data and the other data from the PDU packet and outputs the same to the deshuffling circuit 324.

The deshuffling circuit 324 deshuffles the audio and video data input from the demultiplexing circuit 322 by a method corresponding to the shuffling circuit 50 and outputs the same to the concealment circuit 326.

The concealment circuit 326 performs error detection by using the CRC data contained in the PDU packet etc. and performs the concealment (error concealment) with respect to the input audio and video data.

The word width converting circuit 328 converts the concealed 8 bit-parallel audio and video data to the 10 bit-parallel data adapted to the SDI system and outputs this to the parallel/serial converting circuit 330.

The parallel/serial converting circuit 330 converts the 10 bit-parallel data to the data of the SDI system of 143 Mbps serial, converts this to the audio and video data RVD of the D2 standard, and outputs the resultant data to the digital video tape recorder 34.

The digital video tape recorder 34 (FIG. 1) records the audio and video data RVD input from the parallel/serial converting circuit 330 in synchronization with the internal clock $4f_{sc}$.

The clock generator 38 is an audio control oscillation circuit having for example a crystal oscillation circuit, generates the internal clock $4f_{sc}$ of a frequency in accordance with the control of the clock control apparatus 36 via the clock control signal CC, and supplies this to the respective constituent portions of the transmitting apparatus 30.

The clock control apparatus 36 operates as a type of phase locked loop circuit (PLL circuit), generates a clock control signal CC based on the internal clock $4f_{sc}$, the line clock NCLK, and the synchronization data RTS input from the receiving apparatus 32, controls the frequency of the internal clock $4f_{sc}$ generated by the clock generator 38 via this clock control signal CC, and brings the internal clock $4f_{sc}$ of the transmitting apparatus 30 into synchronization with the internal clock $4f_{sc}$ of the transmitting apparatus 10.

Below, an explanation will be made of the operation of the data transmitting system 1.

In the transmitting apparatus 10, the digital video tape recorder 14 reproduces the audio and video data of the D2 standard and outputs this as the audio and video data PVD of 143 Mbps to the transmitting apparatus 18.

On the other hand, the residual time stamp generator 16 generates the synchronization data RTS based on the internal clock $4f_{sc}$ generated by the clock generator 12 and the line clock NCLK supplied by the ATM communication line 20 and successively outputs this to the transmitting apparatus 18.

In the transmitting apparatus 18, the shuffling circuit 50 stores the video data in the input order as mentioned above, reads the same according to the order of the address generated by the computation, and performs the shuffling processing. The multiplexing circuit 186 and the ATM cell generating circuit 188 multiplex the audio data, the data RTS generated by the main memory 16, etc. and the video data after the shuffling in the PDU packet shown in FIG. 13, convert the same to the ATM cell, and transmit the resultant data via the ATM communication line 20 to the transmitting apparatus 30.

The ATM communication line 20 transmits the ATM cell transmitted from the transmitting apparatus 10 to the transmitting apparatus 30 and, at the same time, supplies the line clock NCLK to the transmitting apparatus 30.

In the transmitting apparatus 30, the ATM cell transmitted from the transmitting apparatus 10 is received by the receiving apparatus 32, the address portion of the ATM cell is removed, and the PDU packet is reproduced.

Further, the receiving apparatus 32 outputs the audio and video data corresponding to the audio and video data PVD of the transmitting apparatus 10 demultiplexed from the PDU packet to the digital video tape recorder 34, and the digital video tape recorder 34 records this.

The clock control apparatus 36 controls the clock generator 38 based on the synchronization data RTS contained in the PDU packet and the line clock NCLK and brings the frequency of the internal clock $4f_{sc}$ of the transmitting apparatus 30 into synchronization with the internal clock $4f_{sc}$ of the transmitting apparatus 10.

As mentioned above, as the interface of the digital video tape recorders 14 and 34, the SDI system which has been widely used as infrastructure in television broadcasting stations etc. is used, therefore it has a good match with the already existing equipment and the effective utilization of the already existing equipment can be achieved.

Note that, the circuit configuration of the respective portions of the data transmitting system 1 shown in the above embodiment, the logical values and the waveforms of the signals, etc. are examples. It is also possible to replace these by circuits which can realize equivalent functions.

Further, in the above embodiment, the video tape recorder apparatus was mentioned as an apparatus connected to the transmitting apparatus 18, but the present invention is not restricted to this. It is also possible to constitute the system so that an editing apparatus for inputting and outputting data by for example the SDI system or the transmission equipment of the SDI system is connected to the transmitting apparatus 18.

Further, the PDU packet shown in FIG. 13 is an example. The present invention can be adapted to a transmitting system using a transmission packet of another format.

Further, the present invention is not limited to the combination of the SDI system and the ATM system. It can be applied to a transmitting apparatus of any system in which the frequency of the line clock and the frequency of the internal clock exhibit the relationship of an integral ratio and which is connected to a communication line which can supply uniform and correct line clocks to the respective nodes, for example, an N-ISDN communication line or dedicated data line. Further, it is expected that the data transmitting system according to the present invention can be widely applied also to a transmitting system which may be developed from now.

Further, the data transmitting system 1 according to the present invention can be applied to, in addition to the audio and video data, either data of them, or data for information processing, etc.

Note that, it is also possible even if the number of lines of the unit block is changed for every unit block. For example, it is also possible to constitute the apparatus so that the leading 23 lines of the video are shuffled by using the shuffling coefficient shown in (2-1) and the subsequent 25 lines are shuffled by using the shuffling coefficient shown in (2-2).

Further, it is also possible even if the apparatus is constituted so that a means for measuring the quality of the communication line is further provided and the method of division of the unit block and the shuffling coefficient are changed in accordance with the quality of the communication line.

As explained above, the data shuffling method and the apparatus for the same according to the present invention enable the dummy data added to the video data for the shuffling to be reduced as much as possible.

Further, the data shuffling method and the apparatus for the same according to the present invention enable the video data etc. to be shuffled by the optimum shuffling method in accordance with the quality of the communication line.

Further, the data shuffling method and the apparatus for the same according to the present invention enable enable the shuffling to be carried out by a method which is complex and has a high concealment capability with respect to data error when the quality of the communication line is bad and the shuffling to be carried out by a method having a small processing delay when the quality of the communication line is good.

While the invention has been described by reference to specific embodiments chosen for purposes of illustration, it should be apparent that numerous modifications could be made thereto by those skilled in the art without departing from the basic concept and scope of the invention.

What is claimed is:

1. A data shuffling method for shuffling data for rearranging predetermined data which are contained in a plurality of data units in predetermined numbers each and can be interpolated by using adjoining data in a two-dimensional array comprised of these data units so as to facilitate concealment of data errors occurring during transmission, said data shuffling method including the steps of:
dividing the two-dimensional array into a plurality of processing units each containing a predetermined number of the data units;
establishing correspondence between each of the predetermined data and each serial number indicating the position of each of the predetermined data in each the processing units for every processing unit;
calculating for every processing unit each of the sums or differences of each of the serial numbers corresponding to each of the predetermined data with a predetermined coefficient;
calculating for every processing unit each of the values of the remainder system of each of the sums or the differences with respect to the maximum value of the serial numbers; and
arranging each of the predetermined data corresponding to each of the values of the remainder system at a position in the processing unit indicated by each of the values of the remainder system to shuffle the predetermined data for every processing unit.

2. A data shuffling method as set forth in claim 1, wherein each of the predetermined coefficients corresponding to each of the processing units is set so that:
the values of the remainder system do not overlap in each of the processing units and when all of the predetermined data contained in only a predetermined number of successive data units at any position of each of the processing units after the shuffling are destroyed, the destroyed predetermined data hold a predetermined interval among them when these predetermined data are returned to the positions in each of the processing units before the shuffling.

* * * * *